(12) United States Patent
Cheng et al.

(10) Patent No.: US 10,453,959 B2
(45) Date of Patent: Oct. 22, 2019

(54) FIN REPLACEMENT IN A FIELD-EFFECT TRANSISTOR

(71) Applicant: International Business Machines Corporation, Armonk, NY (US)

(72) Inventors: Kangguo Cheng, Schenectady, NY (US); Pouya Hashemi, White Plains, NY (US); Ali Khakifirooz, Los Altos, CA (US); Alexander Reznicek, Troy, NY (US); Dominic J. Schepis, Wappingers Falls, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/425,190

(22) Filed: Feb. 6, 2017

(65) Prior Publication Data

US 2017/0148916 A1 May 25, 2017

Related U.S. Application Data

(62) Division of application No. 14/568,969, filed on Dec. 12, 2014, now Pat. No. 9,660,059.

(51) Int. Cl.
*H01L 29/78* (2006.01)
*H01L 29/66* (2006.01)
*H01L 29/08* (2006.01)

(52) U.S. Cl.
CPC ...... *H01L 29/7848* (2013.01); *H01L 29/0847* (2013.01); *H01L 29/6681* (2013.01); *H01L 29/785* (2013.01)

(58) Field of Classification Search
CPC ............. H01L 29/6681; H01L 29/7848; H01L 29/785; H01L 21/823431; H01L 21/823418
See application file for complete search history.

(56) References Cited

U.S. PATENT DOCUMENTS

| | | | |
|---|---|---|---|
| 6,084,765 A | * | 7/2000 | Lee .................. H01L 28/55 |
| | | | 257/306 |
| 8,313,999 B2 | | 11/2012 | Cappellani et al. |
| 8,685,825 B2 | | 4/2014 | Tang et al. |

(Continued)

OTHER PUBLICATIONS

Bradley, Office Action Communication for U.S. Appl. No. 14/568,969, dated Jan. 6, 2016, 14 pages.

(Continued)

*Primary Examiner* — Stephen M Bradley
(74) *Attorney, Agent, or Firm* — Alvin Borromeo; Hoffman Warnick LLC

(57) ABSTRACT

In a method for fabricating a field-effect transistor (FET) structure, forming a fin on a semiconductor substrate. The method further includes forming a gate on a portion of the fin and the semiconductor substrate. The method further includes epitaxially growing a semiconductor material on the fin. The method further includes depositing oxide covering the fin and the epitaxially grown semiconductor material. The method further includes recessing the deposited oxide and the epitaxially grown semiconductor material to expose a top portion of the fin. The method further includes removing the fin. In another embodiment, the method further includes epitaxially growing another fin in a respective trench formed by removing the first set of fins.

7 Claims, 6 Drawing Sheets

(56) References Cited

U.S. PATENT DOCUMENTS

| | | | |
|---|---|---|---|
| 8,753,942 B2 | 6/2014 | Kuhn et al. | |
| 8,921,940 B2 | 12/2014 | Kim et al. | |
| 8,941,155 B2* | 1/2015 | Kang | H01L 29/7851 |
| | | | 257/288 |
| 2008/0265321 A1* | 10/2008 | Yu | H01L 21/26586 |
| | | | 257/344 |
| 2009/0026505 A1* | 1/2009 | Okano | H01L 29/66795 |
| | | | 257/255 |
| 2011/0068407 A1 | 3/2011 | Yeh et al. | |
| 2011/0147842 A1 | 6/2011 | Cappellani et al. | |
| 2012/0256238 A1* | 10/2012 | Ning | H01L 21/84 |
| | | | 257/280 |
| 2013/0187228 A1 | 7/2013 | Xie et al. | |
| 2013/0200459 A1 | 8/2013 | Adam et al. | |
| 2013/0316503 A1 | 11/2013 | Doris et al. | |
| 2014/0001520 A1 | 1/2014 | Glass et al. | |
| 2014/0027860 A1 | 1/2014 | Glass et al. | |
| 2014/0035059 A1 | 2/2014 | Giles et al. | |
| 2014/0042386 A1 | 2/2014 | Cea et al. | |
| 2014/0070316 A1 | 3/2014 | Chan et al. | |
| 2014/0134814 A1 | 5/2014 | Wong et al. | |
| 2014/0175554 A1 | 6/2014 | Loubet et al. | |
| 2014/0203370 A1* | 7/2014 | Maeda | H01L 29/785 |
| | | | 257/365 |
| 2015/0206939 A1 | 7/2015 | Huang et al. | |
| 2015/0255555 A1* | 9/2015 | Xie | H01L 29/785 |
| | | | 257/401 |
| 2015/0340468 A1 | 11/2015 | Lim et al. | |
| 2016/0013185 A1 | 1/2016 | Greene et al. | |
| 2016/0172462 A1 | 6/2016 | Cheng et al. | |

OTHER PUBLICATIONS

Bradley, Final Office Action Communication for U.S. Appl. No. 14/568,369, dated Jul. 14, 2016, 13 pages.

Bradley, Notice of Allowance and Fee(s) Due for U.S. Appl. No. 14/568,969, dated Jan. 17, 2017, 8 pages.

* cited by examiner

FIN REPLACEMENT IN A FIELD-EFFECT TRANSISTOR

BACKGROUND OF THE INVENTION

The present invention relates generally to the field of semiconductor devices, and more particularly to replacing fins in a field-effect transistor.

Field-effect transistors (FETs) can be semiconductor devices fabricated on a bulk semiconductor substrate or on a silicon-on-insulator (SOI) substrate. FET devices generally consist of a source, a drain, a gate, and a channel between the source and drain. The gate is separated from the channel by a thin insulating layer, typically of silicon oxide, called the gate oxide. A voltage applied between the source and the gate induces an electric field that modulates the conductivity of the channel between the source and the drain thereby controlling the current flow between the source and the drain. Current integrated circuit designs use complementary metal-oxide-semiconductor (CMOS) technology that use complementary and symmetrical pairs of p-type and n-type metal oxide semiconductor field-effect transistors (MOSFETs) for logic functions.

Silicon-germanium (SiGe) is a general term for the alloy $Si_{1-x}Ge_x$, which consists of any molar ratio of silicon (Si) and germanium (Ge). SiGe can be used as a semiconductor material in integrated circuits as a strain-inducing layer for CMOS transistors. SiGe is manufactured on silicon wafers using conventional silicon processing toolsets.

SUMMARY

One aspect of the present invention discloses a method for fabrication of a field-effect transistor (FET) structure. The method includes forming a fin on a semiconductor substrate. The method further includes forming a gate on a portion of the fin and the semiconductor substrate. The method further includes epitaxially growing a semiconductor material on the fin. The method further includes depositing oxide covering the first set of fins and the epitaxially grown semiconductor material. The method further includes recessing the deposited oxide and the epitaxially grown semiconductor material to expose a top portion of the fin. The method further includes removing the fin. In another embodiment, the method further includes epitaxially growing another fin in a respective trench formed by removing the fin.

Another aspect of the present invention discloses a field-effect transistor (FET) structure. The FET structure comprises a fin formed on a semiconductor substrate. The FET structure further comprises a gate formed on a portion of the fin and the semiconductor substrate, wherein the portions of the fin under the gate is a different material than the portions of the fin that are not under the gate. The FET structure further comprises epitaxially grown semiconductor material on the fin. The FET structure further comprises an oxide covering at least a portion of the epitaxially grown semiconductor material and the fin.

BRIEF DESCRIPTION OF THE DRAWINGS

The following detailed description, given by way of example and not intended to limit the disclosure solely thereto, will best be appreciated in conjunction with the accompanying drawings, in which.

DETAILED DESCRIPTION

Figure 1:
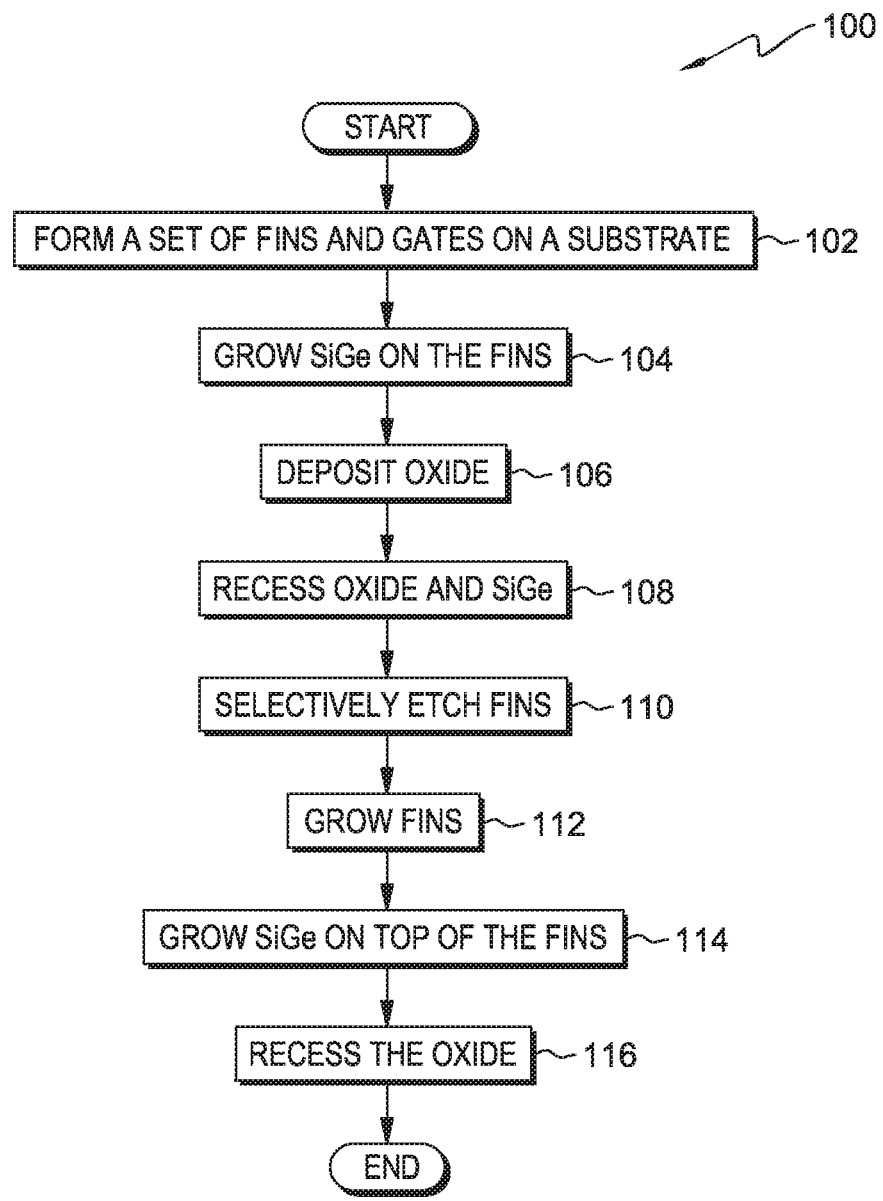
FIG. 1 depicts a flowchart illustrating an exemplary method of fabricating a field-effect transistor (FET), in accordance with embodiments of the present invention.

Detailed embodiments of the claimed structures and methods are disclosed herein; however, it is to be understood that the disclosed embodiments are merely illustrative of the claimed structures and methods that may be embodied in various forms. In addition, each of the examples given in connection with the various embodiments is intended to be illustrative and not restrictive. Further, the Figures are not necessarily to scale, some features may be exaggerated to show details of particular components. Therefore, specific structural and functional details disclosed herein are not to be interpreted as limiting but merely as a representative basis for teaching one skilled in the art to variously employ the methods and structures of the present disclosure.

References in the specification to "one embodiment," "an embodiment," "an example embodiment," etc. indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper," "lower," "right," "left," "vertical," "horizontal," "top," "bottom," and derivatives thereof shall relate to the disclosed structures and methods, as oriented in the drawing figures. The terms "overlying," "atop," "on," "positioned on," or "positioned atop" mean that a first element, such as a first structure, is present on a second element, such as a second structure, wherein intervening elements, such as an interface structure may be present between the first element and the second element. The term "direct contact" means that a first element and a second element are connected without any intermediary conducting, insulating, or semiconductor layers at the interface of the two elements.

Some embodiments of the present invention recognize that it can be desirable to utilize silicon-germanium (SiGe) in source/drain epitaxy to increase strain and enhance performance of a field-effect transistor (FET) device. Junction formation in FinFET is accomplished utilizing out-diffusion from source/drain merge epitaxy into a channel region under a spacer. High dopant levels are utilized for contact formation, and very high dopant levels are desirable to form good contact and achieve low contact resistance. High dopant level close to the gate can lead to high diffusion of dopant under the spacer during extension formation anneal and are capable of shorting the device. Embodiments of the present invention recognize a trade-off between good junction formation (without shorting) and high doping levels for good contact formation (low contact resistance). Additional embodiments of the present invention recognize that anneals can relax the strain in the SiGe and eliminating the need for anneal is further beneficial.

Embodiments of the present invention generally provide a method to selectively remove un-doped fins in the source/drain region after an unmerged epitaxy has been formed around the un-doped fins. New fins can then be regrown utilizing a different material. For example, new fins can be comprised of SiGe, Boron doped Silicon, Boron doped SiGe, higher percentage SiGe, or other types of materials. Replacing the fin with doped material can reduce (or eliminate) the need for diffusion processes and additionally can provide the benefit of additional stressor material. In additional embodiments, after fin removal and before fin regrowth, the method can etch the fin under the space, which can move the junction and stressor material even closer to under the channel region.

The present invention will now be described in detail with reference to the Figures. FIG. 1 is a functional block diagram illustrating fabrication process 100, an exemplary method for fabricating a FET, in accordance with one embodiment of the present invention.

Figure 2A:
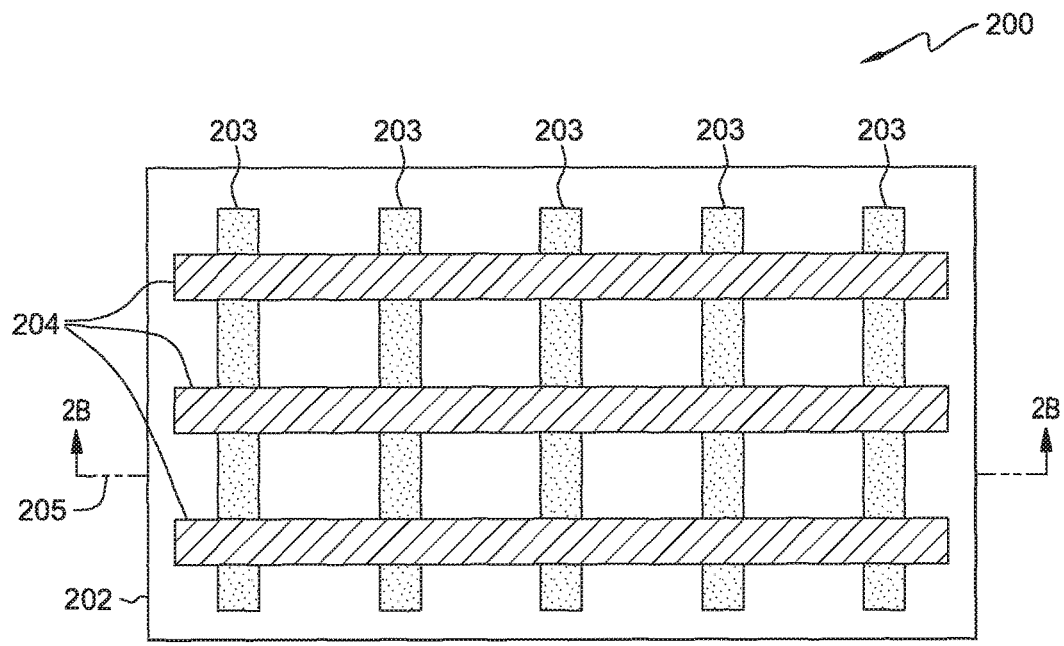
FIG. 2A depicts a top-down view of a FET with a formation of fins and gates on a substrate, in accordance with embodiments of the present invention.

In step 102, fabrication process 100 forms a set of fins and gates on a substrate. In one embodiment, fabrication process 100 forms a set of fins on a substrate and a set of corresponding gates on the formed structure of fins and the substrate. In various embodiments, the substrate can be a semiconductor on insulator (SOI) substrate, which can include a buried oxide (BOX) layer. In an example, fabrication process 100 forms FET 200 (depicted in FIG. 2A), which includes substrate 202, fins 203, and gates 204. FIG. 2A depicts a top-down view of FET 200. Fabrication process 100 forms the set of fins 203 and gates 204 on substrate 202 utilizing conventional semiconductor fabrication techniques. In another embodiment, FET 200 can include a different number of fins in fins 203 and a different number of gates in gates 204 (e.g., more or less fins and gates). In an example embodiment, fins 203 are un-doped Si fins.

Substrate 202 may be composed of a silicon containing material. Silicon containing materials include, but are not limited to, Si, single crystal Si, polycrystalline Si, SiGe, single crystal silicon germanium, polycrystalline silicon germanium, or silicon doped with carbon, amorphous Si, and combinations and multi-layers thereof. Substrate 202 may also be composed of other semiconductor materials, such as germanium and compound semiconductor substrates, such as type III/V semiconductor substrates, e.g., GaAs. Although substrate 202 is depicted as a silicon on insulator substrate (SOI) or semiconductor on insulator substrate, bulk semiconductor substrates arrangements are also suitable for substrate 202. In additional embodiments, substrate 202 contains a dielectric coating over the bulk semiconductor to isolate the source/drain/gate metals, keeping the source/drain/gate metals from shorting. The dielectric coating can be $SiO_2$ (thermal, plasma-enhanced chemical vapor deposition (PECVD), (low temperature oxide (LTO)), $Al_2O_3$ or $HfO_2$ (e.g., atomic layer deposition (ALD) deposited), $Si_3N_4$ (silicon nitride), etc. In another embodiment, substrate 202 is a sapphire substrate (e.g., $Al_2O_3$ bulk).

Figure 2B:
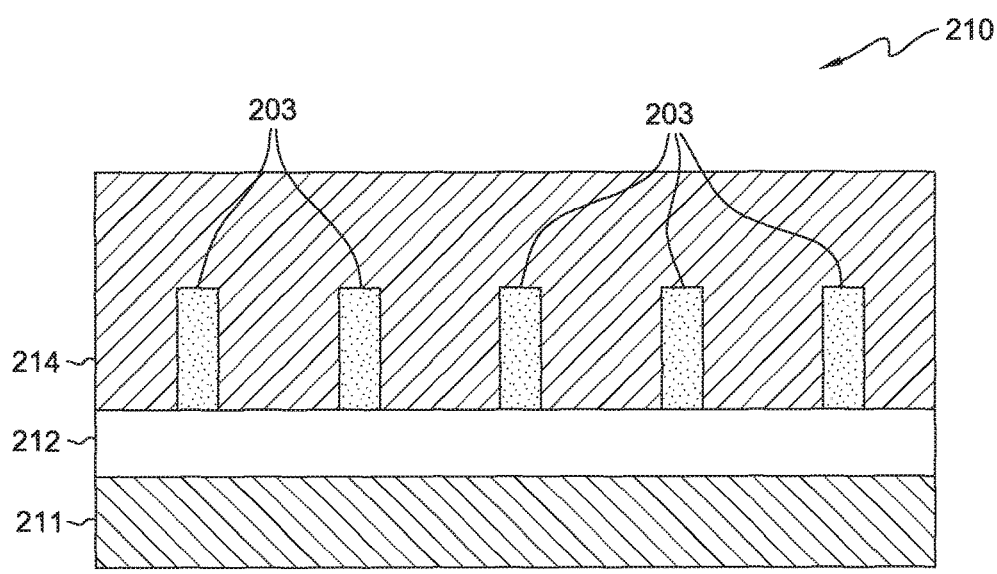
FIG. 2B depicts a cross-sectional view of the formation of fins and gates of FIG. 2A, in accordance with embodiments of the present invention.

In another example, FET 210 (FIG. 2B) depicts a cross-sectional view of FET 200 from the perspective of cross-section line 205. FET 210 depicts a cross-sectional view of the array of fins 203 and gate 214, which is one of the gates of gates 204. FET 210 includes substrate 211 and BOX 212. In various embodiments, BOX 212 can be silicon oxide ($SiO_2$) that acts to insulate the formation of fins and gates (e.g., fins 203 and gates 204) from substrate 211. BOX 212 can be formed by thermally oxidizing the exposed surface of substrate 211 or may be deposited onto substrate 211 using, for example, chemical vapor deposition (CVD) or atomic layer deposition (ALD). Fabrication process 100 can then bond fins 203 and gates 204 to BOX 212.

In step 104, fabrication process 100 grows SiGe on the fins. In one embodiment, fabrication process 100 epitaxially grows SiGe on the fins (formed in step 102) in the source and drain regions of the FET. In various embodiments, the source and drain regions are the portions of the FET that are not covered by a gate (e.g., a gate formed in step 102). Fabrication process 100 grows SiGe on the fins to form an unmerged epitaxy on the fins, which means that the epitaxial growth on one fin does not touch (or merge with) the epitaxial growth on another fin. In example embodiments, fabrication process 100 epitaxially grows highly doped SiGe (e.g., 35% SiGe) on exposed surfaces of the fins (formed in step 102). In another embodiment, fabrication process 100 epitaxially grows SiGe on the fins, forming an unmerged diamond-shaped epitaxy in the source and drain region of the FET. In other embodiments, fabrication process 100 can grow semiconductor materials, other than SiGe or a different concentration of SiGe, etc. Examples of various epitaxial growth process apparatuses that may be suitable for use performing the epitaxy may include, for example, rapid thermal chemical vapor deposition (RTCVD), low-energy plasma deposition (LEPD), ultra-high vacuum chemical vapor deposition (UHVCVD), atmospheric pressure chemical vapor deposition (APCVD), and molecular beam epitaxy (MBE).

Figure 3A:
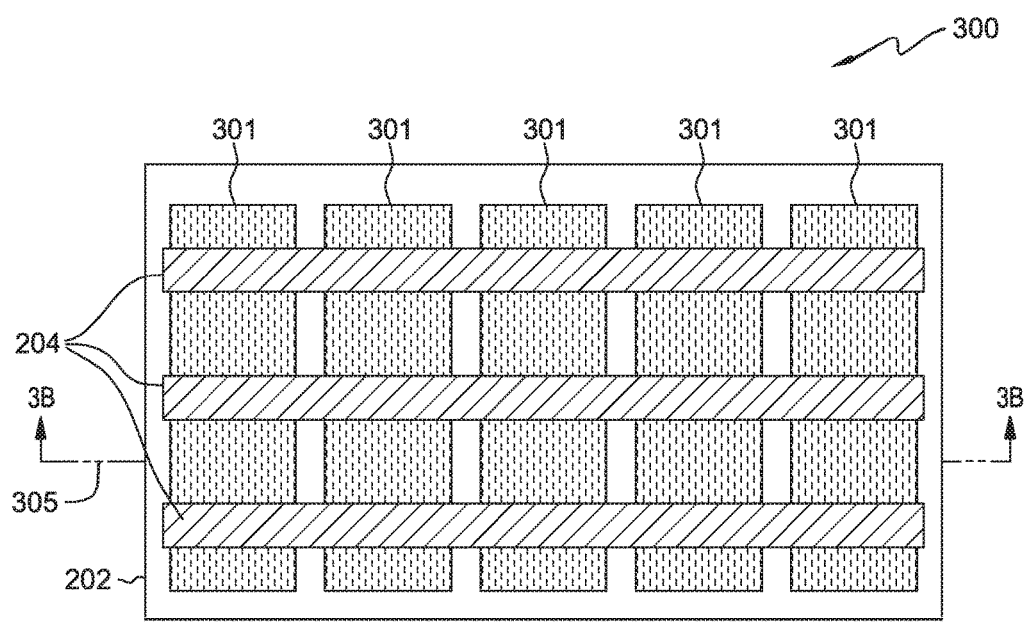
FIG. 3A depicts a top-down view of epitaxial growth on the fins in the source and drain region of the FET of FIG. 2A, in accordance with embodiments of the present invention.
Figure 3B:
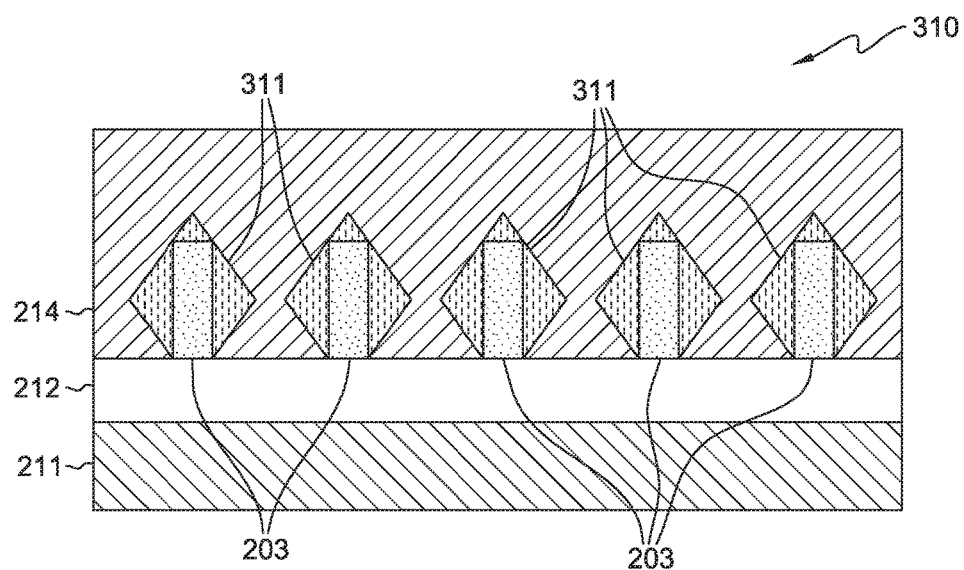
FIG. 3B depicts a cross-sectional view of the FET structure of FIG. 3A, in accordance with embodiments of the present invention.

In an example, fabrication process 100 epitaxially grows SiGe on fins 203 in the source and drain regions of FET 200 and FET 210, which forms FET 300 (depicted in FIG. 3A) and FET 310 (depicted in FIG. 3B). FIG. 3A depicts a top-down view of FET 300, which includes SiGe epitaxy 301. SiGe epitaxy 301 is grown on fins 203 (of FET 200 and FET 210) and is an unmerged epitaxy. In an example embodiment, SiGe epitaxy 301 is a highly doped SiGe (e.g., 35% SiGe), which is grown as a diamond-shaped epitaxy.

In another example, FET 310 (FIG. 3B) depicts a cross-sectional view of FET 300 from the perspective of cross-section line 305. FET 310 depicts a cross-sectional view of the diamond-shaped epitaxial growth of SiGe epitaxy 311 on fins 203. The diamond-shaped epitaxy of SiGe epitaxy 311 is unmerged (e.g., the diamond-shaped epitaxial growth on fins 203 do not touch). In an example embodiment, SiGe epitaxy 311 is a highly doped SiGe (e.g., 35% SiGe). In various embodiments, the diamond shape observed in the unmerged source-drain regions of FET 310 (and FET 300) may be a result of different growth rates during the epitaxial deposition process inherent to each crystallographic orientation plane of the single-crystal material forming SiGe epitaxy 311 (and SiGe epitaxy 301). In other embodiments, SiGe epitaxy 311 (and SiGe epitaxy 301) may have a shape other than the diamond shape depicted in FIG. 3B.

In step 106, fabrication process 100 deposits oxide. In one embodiment, fabrication process 100 deposits an oxide that fills in the gaps of the unmerged SiGe epitaxy (from step 104) and covers the SiGe epitaxy on the fins (e.g., but does not cover the gates). In example embodiments, fabrication process 100 can deposit a flowable oxide, silicon dioxide ($SiO_2$), or another material that is capable of filling the gaps in the SiGe epitaxy.

Figure 4A:
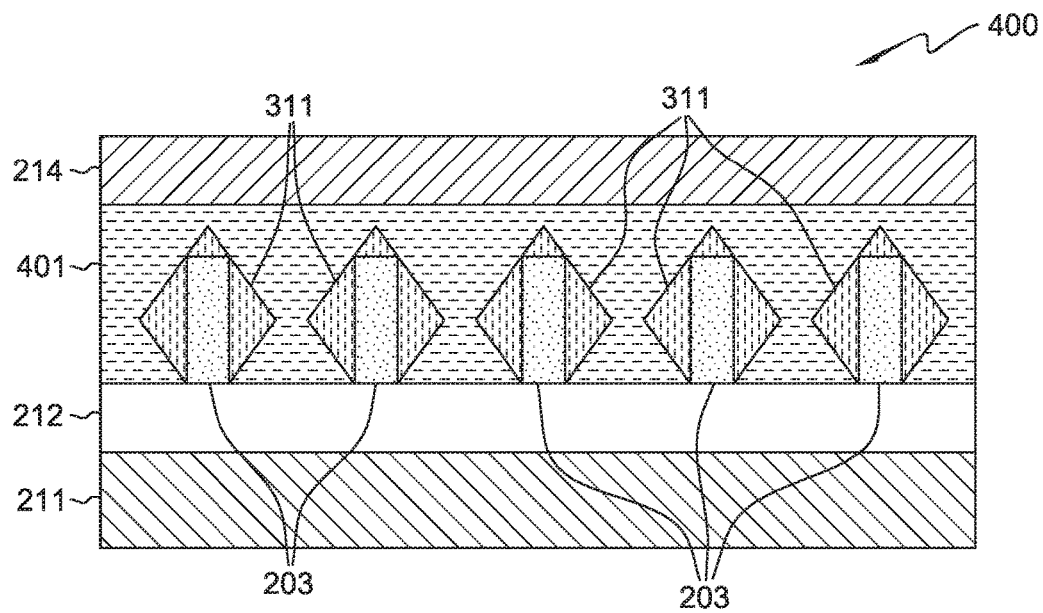
FIG. 4A depicts a cross-sectional view of oxide deposited into the FET structure of FIG. 3B, in accordance with embodiments of the present invention.

In an example, fabrication process 100 deposits flowable oxide 401 on FET 400 (depicted in FIG. 4A). Fabrication process 100 deposits flowable oxide 401 filling in and covering SiGe epitaxy 311 on fins 203. For example, flowable oxide 401 fills in the gaps that are the result of the unmerged epitaxy on fins 203 (from step 104). In example embodiments, flowable oxide 401 can be any type of flowable oxide that is capable of filling in the gaps of the unmerged epitaxy (e.g., a diamond shaped epitaxy).

In step 108, fabrication process 100 recess oxide and SiGe. In one embodiment, fabrication process 100 recesses the oxide (deposited in step 106) and a portion of the SiGe epitaxy (of step 104), which exposes the tops of the fins (formed in step 102). In an example embodiment, fabrication process 100 recesses the oxide, which exposes the top of the epitaxial growth on the fin (e.g., the tip of the diamond shaped epitaxy on top of the fin). Then, fabrication process 100 removes the exposed top of the epitaxial growth on top of the fins (e.g., utilizing reactive-ion etching (RIE)), which exposes the top of the fins. In various embodiments, fabrication process 100 utilizes RIE or other lithography techniques to remove oxide and SiGe (e.g., chlorine-based RIE chemistry, Argon (Ar) milling, etc.).

Figure 4B:
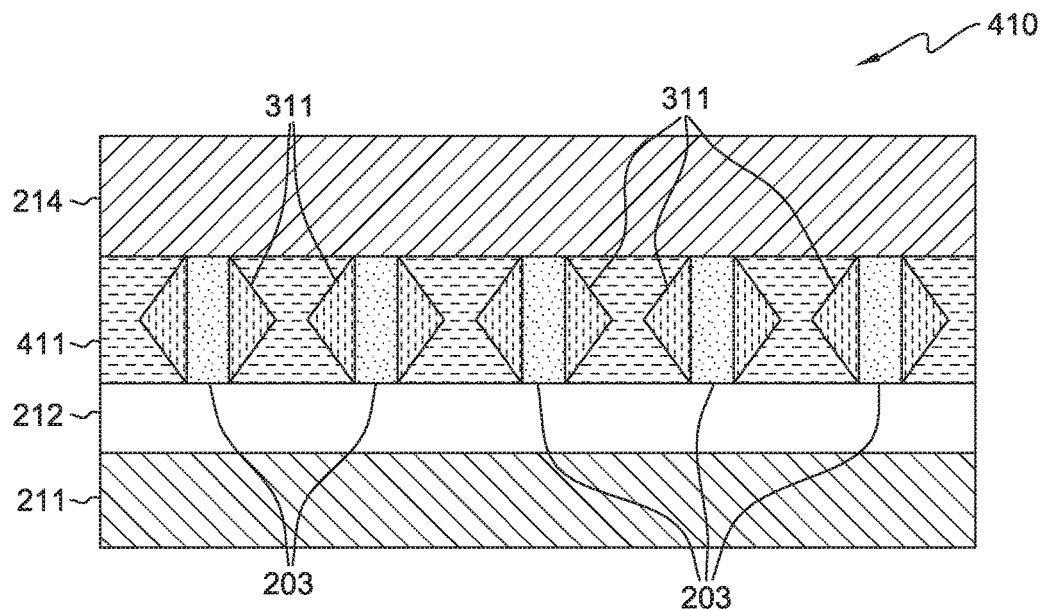
FIG. 4B depicts a cross-sectional view of the oxide and epitaxy of FIG. 4A recessed to expose the fins, in accordance with embodiments of the present invention.

In an example, fabrication process 100 recesses flowable oxide 401 and SiGe epitaxy 311 of FET 400, which results in FET 410 (depicted in FIG. 4B). FET 410 includes recessed oxide 411, which fabrication process 100 recessed to expose the top of SiGe epitaxy 311 (depicted in FET 400). Fabrication process 100 recesses flowable oxide 401 (of FET 400) down to form recessed oxide 411, which exposes the diamond tips of the diamond-shaped epitaxy of SiGe epitaxy 311 on fins 203. Then, fabrication process 100 utilizes RIE to recess the diamond tips of the diamond-shaped epitaxy of SiGe epitaxy 311, which exposes the tops of fins 203 (e.g., un-doped Si fins). In additional embodiments, fabrication process 100 can utilize other techniques to expose the tops of fins 203.

In step 110, fabrication process 100 selectively etches the fins. In one embodiment, fabrication process 100 selectively etches and removes the fins exposed in step 108 (e.g., the un-doped Si fins in the source and drain region of the FET). In an example embodiment, fabrication process 100 removes the fins utilizing a selective dry etching process (e.g., RIE or another etching process that removes the fins but not the oxide). In another example embodiment, fabrication process 100 removes the fins utilizing a selective wet etching process. In other example embodiments, fabrication process 100 removes the fins utilizing other semiconductor fabrication processes that are capable of removing the fins (e.g., etching straight downward) and not removing the oxide. In an additional embodiment, fabrication process 100 etches the exposed areas of the fins in the source and drain region but does not etch the portions of the fins that are under the gates (formed in step 102).

Figure 5A:
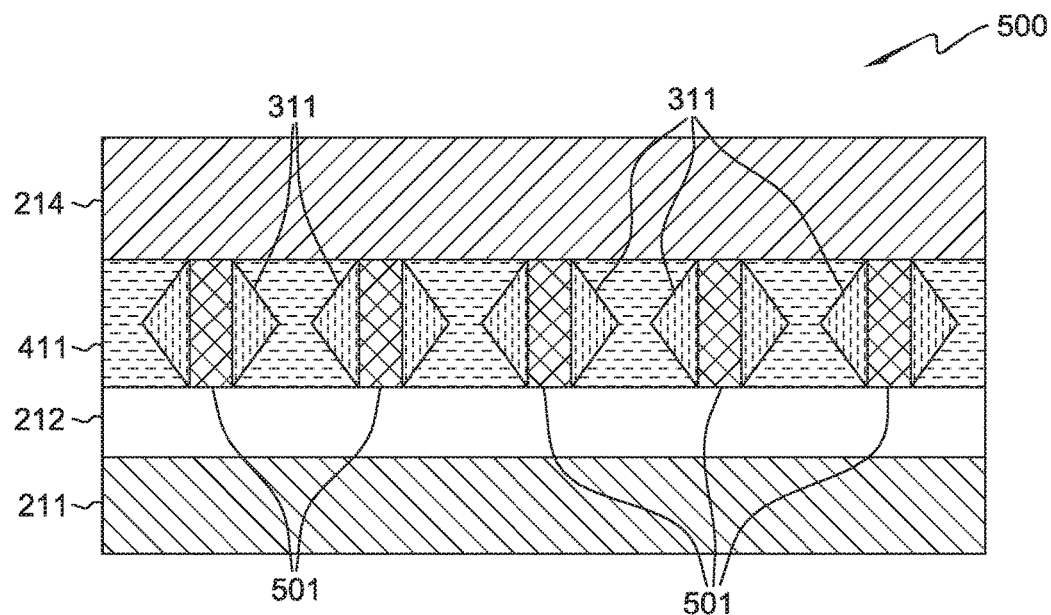
FIG. 5A depicts a cross-sectional view of the exposed fins of FIG. 4B recessed and removed, in accordance with embodiments of the present invention.

In an example, fabrication process 100 selectively removes (e.g., via RIE) fins 203 from FET 410, which results in FET 500 (depicted in FIG. 5A). FET 500 includes removed fins 501, which are the empty areas (e.g., trenches) of FET 500 that are the result of fabrication process 100 removing the fins (e.g., fins 203 of FET 410). In various embodiments, fabrication process 100 removes fins 203 utilizing a downward etching process (e.g., a dry etch, a wet etch, etc.).

In step 112, fabrication process 100 grows fins. In one embodiment, fabrication process 100 epitaxially regrows fins in the areas of the FET that were etched in step 110 (e.g., the resulting trenches). In another embodiment, fabrication process 100 grows fins that are comprised of a different material (e.g., different than un-doped Si) than the removed fins (etched/removed in step 110). For example, fabrication process 100 regrows fins that are comprised of high Ge content SiGe (e.g., 75% SiGe). In other examples, the regrown fins can be SiGe, Boron doped Silicon, Boron doped SiGe, higher percentage SiGe, or other types of materials.

Figure 5B:
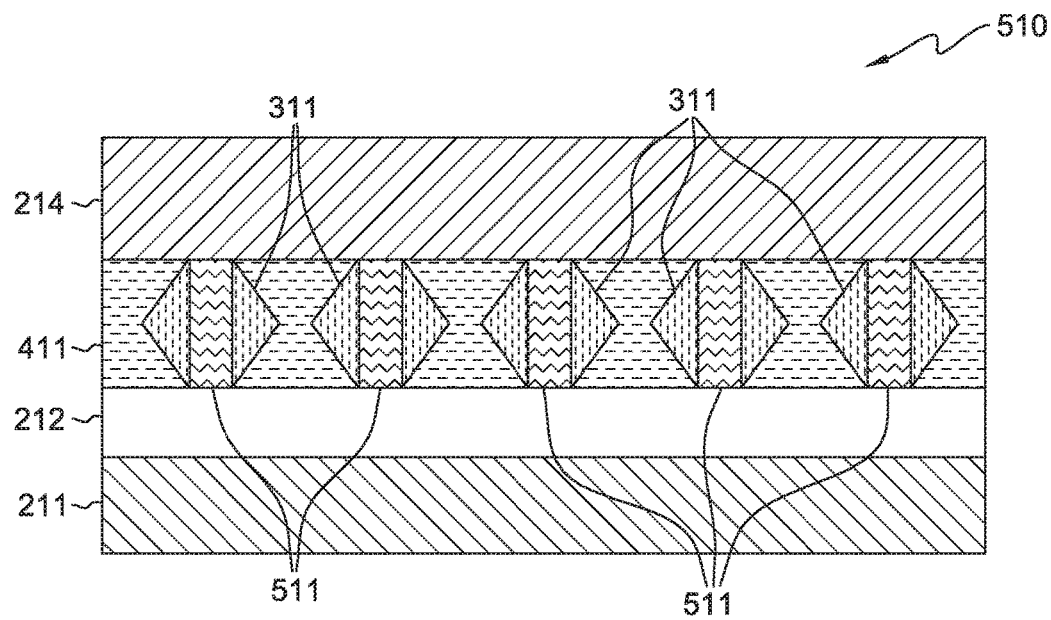
FIG. 5B depicts fins regrown in the recessed portions of FIG. 5A, in accordance with embodiments of the present invention.

In an example, fabrication process 100 grows (via selective epitaxy) regrown fins 511 in removed fins 501 (of FET 500), which results in FET 510 (depicted in FIG. 5B). In one embodiment, regrown fins 511 are high Ge content SiGe (e.g., 75% SiGe) fins. In another embodiment, regrown fins 511 are fins with a lower amount of boron doping compared to SiGe epitaxy 311. In additional embodiments, regrown fins 511 can be comprised of SiGe, Boron doped Silicon, Boron doped SiGe, higher percentage SiGe, or other types of materials.

In step 114, fabrication process 100 grows SiGe on top of the fins. In one embodiment, fabrication process 100 epitaxially grows SiGe (e.g., highly doped SiGe (e.g., 35% SiGe)) on top of the regrown fins (from step 112). In an example embodiment, fabrication process 100 epitaxially grows SiGe tips (e.g., "tips" of the diamond) on a top exposed surface of the regrown fins to form a diamond-shaped unmerged epitaxy structure in the source and drain region of the FET (e.g., substantially similar to the diamond-shaped structure formed in step 104). In another embodiment, step 114 is optional and fabrication process 100 proceeds to step 116 without performing step 114.

Figure 6A:
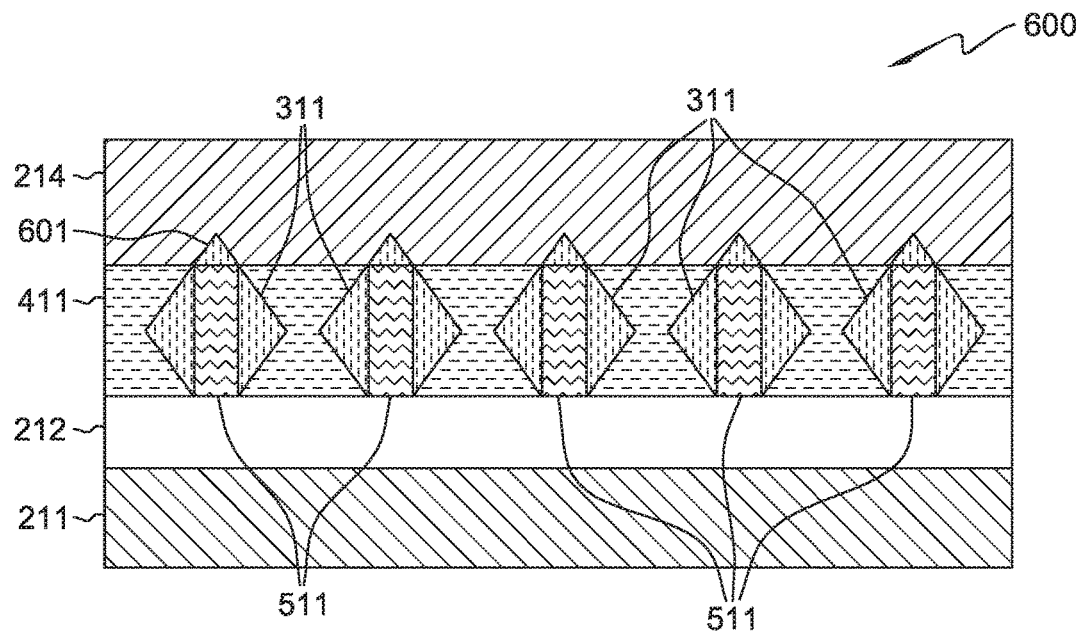
FIG. 6A depicts a cross-sectional view of epitaxial growth on the top of the regrown fins of FIG. 5B, in accordance with embodiments of the present invention.

In an example, fabrication process 100 grows SiGe tips 601 (via epitaxy) on top of regrown fins 511 (of FET 510), which results in FET 600 (depicted in FIG. 6A). SiGe tips 601 and SiGe epitaxy 311 combine to form a diamond-shaped unmerged epitaxy structure (e.g., the structure formed in step 104). In an example embodiment, SiGe tips 601 are comprised of highly doped SiGe (e.g., 35% SiGe).

Figure 6B:
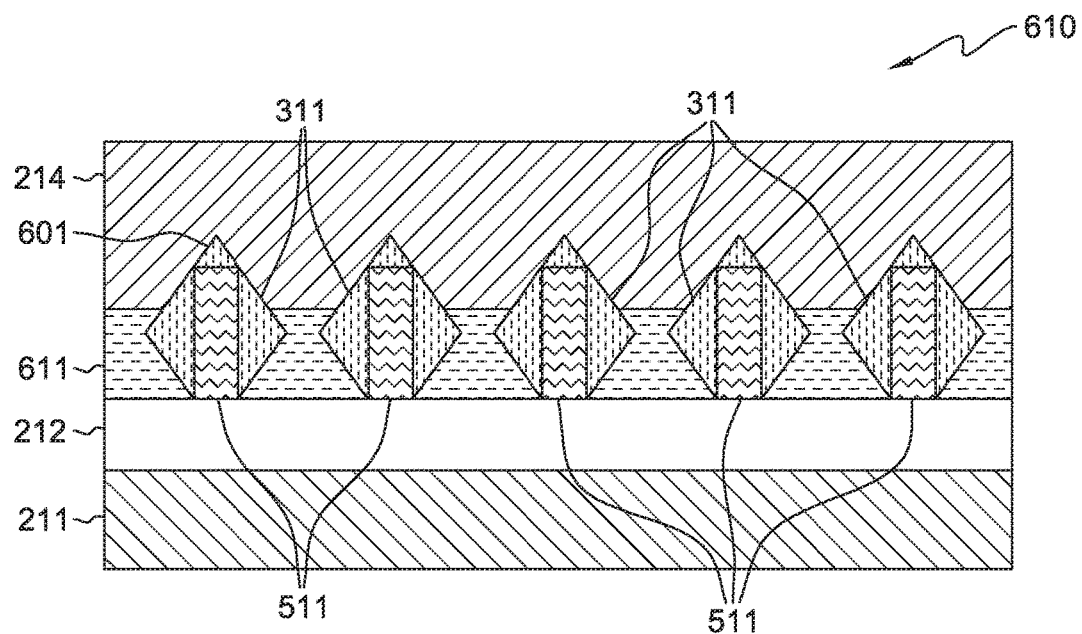
FIG. 6B depicts a cross-sectional view of a recess to the oxide of FIG. 6A, in accordance with embodiments of the present invention.

In step 116, fabrication process 100 recesses the oxide. In one embodiment, fabrication process 100 recesses the oxide (deposited in step 106 and first recessed in step 108) down in the FET. In an example, fabrication process 100 recesses oxide in FET 600 (i.e., recessed oxide 411 in FIG. 6A), which forms recessed oxide 611 in FET 610 (depicted in FIG. 6B). In various embodiments, fabrication process 100 utilizes RIE or other lithography techniques to remove and/or recess oxide. In example embodiments, FET 600 includes regrown fins 511 and the fin area under gate 214 (and gates 204) is an un-doped Si fin. In an example where regrown fins are high percentage SiGe, the stressor of FET 600 can be increased (in relation to using Si). Utilizing high percentage SiGe can also enhance strain in FET 600 and form "ultra-sharp" junction in FET 600. In another example embodiment, FET 600 can need no, or very little, additional diffusion or annealing. In an additional embodiment, fabrication process 100 can operate utilizing bulk Si and/or bulk FinFET materials.

What is claimed is:

1. A field-effect transistor (FET) structure comprising:
   a semiconductor substrate;
   an insulating layer on the semiconductor substrate;
   a plurality of fins formed on the insulating layer, the insulating layer physically separating each of the plurality of fins from the semiconductor substrate;
   a gate formed on a portion of each of the plurality of fins and the insulating layer on the semiconductor substrate, wherein the portion of each of the plurality of fins under the gate is a different material than the portion of each of the plurality of fins that is not under the gate;
   epitaxially grown semiconductor material on each of the plurality of fins, wherein the epitaxially grown semiconductor material includes a diamond-shaped unmerged epitaxial growth, wherein the diamond-shaped unmerged epitaxial growth on each of the plurality of fins does not contact the diamond-shaped unmerged epitaxial growth on any adjacent fin of the plurality of fins, the diamond-shaped unmerged epitaxial growth including:
      a first epitaxial growth of a first semiconductor material on opposing sides of each of the plurality of fins, the first epitaxial growth of the first semiconductor material extending on the opposing sides of each of the plurality of fins from a surface of the insulating layer on which each of the plurality of fins are formed to a top surface of each of the plurality of fins; and
      a second epitaxial growth of the first semiconductor material on the top surface of each of the plurality of fins, the second epitaxial growth of the first semiconductor material forming a tip of the diamond-shaped unmerged epitaxial growth;
   and
   an oxide covering at least a portion of the epitaxially grown semiconductor material and each of the plurality of fins.

2. The FET structure of claim 1:
   wherein the first semiconductor material is silicon-germanium (SiGe).

3. The FET structure of claim 1:
   wherein the portion of each of the plurality of fins under the gate is un-doped silicon; and
   wherein the portion of each of the plurality of fins that is not under the gate is silicon-germanium (SiGe).

4. The FET structure of claim 1:
   wherein the portion of each of the plurality of fins under the gate is un-doped silicon; and
   wherein the portion of each of the plurality of fins that is not under the gate is boron doped silicon.

5. The FET structure of claim 1:
   wherein the portion of each of the plurality of fins under the gate is un-doped silicon; and
   wherein the portion of each of the plurality of fins that is not under the gate is boron doped silicon-germanium (SiGe).

6. The FET structure of claim 1;
   wherein the portion of each of the plurality of fins under the gate is un-doped silicon; and
   wherein the portion of each of the plurality of fins that is not under the gate is silicon-germanium (SiGe) that includes a higher concentration of SiGe than the epitaxially grown semiconductor material.

7. The FET structure of claim 1, wherein the oxide is a flowable oxide.

* * * * *